United States Patent [19]
Müller et al.

[11] 4,275,406
[45] Jun. 23, 1981

[54] MONOLITHIC SEMICONDUCTOR PRESSURE SENSOR, AND METHOD OF ITS MANUFACTURE

[75] Inventors: Bernt Müller; Ulrich Theden, both of Berlin, Fed. Rep. of Germany

[73] Assignee: Robert Bosch GmbH, Stuttgart, Fed. Rep. of Germany

[21] Appl. No.: 26,743

[22] Filed: Apr. 3, 1979

[30] Foreign Application Priority Data

Sep. 22, 1978 [DE] Fed. Rep. of Germany ....... 2841312

[51] Int. Cl.$^3$ ............................................. H01L 27/20
[52] U.S. Cl. ............................................ 357/26; 338/4; 357/41; 357/55; 357/60
[58] Field of Search ........................ 357/26, 55; 338/4; 357/41, 60

[56] References Cited
U.S. PATENT DOCUMENTS

| | | | |
|---|---|---|---|
| 3,758,830 | 9/1973 | Jackson | 357/26 |
| 3,761,784 | 9/1973 | Jund | 357/26 |
| 3,893,228 | 7/1975 | George et al. | 357/26 |
| 4,125,820 | 11/1978 | Marshall | 357/26 |
| 4,131,524 | 12/1978 | Gieles | 357/26 |
| 4,204,185 | 5/1980 | Kurtz et al. | 357/26 |

*Primary Examiner*—William D. Larkins
*Attorney, Agent, or Firm*—Frishauf, Holtz, Goodman & Woodward

[57] ABSTRACT

To provide a pressure sensor with good reproducibility, a cavern of elliptical outline is etched into a highly conductive monocrystalline n+ doped silicon chip, leaving a thin membrane of an epitaxial layer of elliptical outline, in which the ratio of the elliptical axes is about 2:1 and the elliptical axes extend at an angle of 45° with respect to the (100) and (010) crystal axes; a resistance bridge, which may be formed by boron diffusion or ion implantation, or by transistor integrated circuit technology, is applied to the center of the membrane, having its resistance or transistor, for example FET transistor, branches arranged at the 45° angle with respect to said crystal axes. Etching can be carried out electrochemically in a bath of diluted hydrofluoric acid, utilizing the differential conductivity between the epitaxial layer and an unmasked portion of the doped silicon to leave a membrane of the epitaxial layer; or by chemical etching in a bath of hydrofluoric acid, nitric acid, and acetic acid.

11 Claims, 7 Drawing Figures

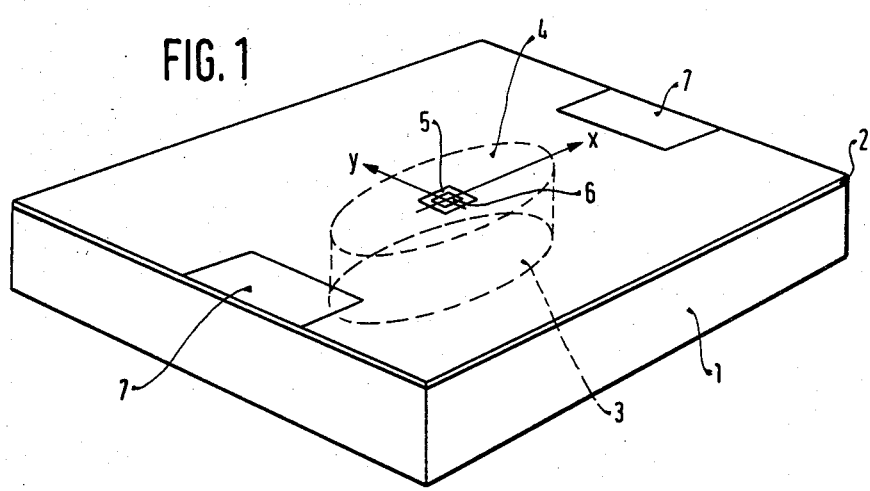
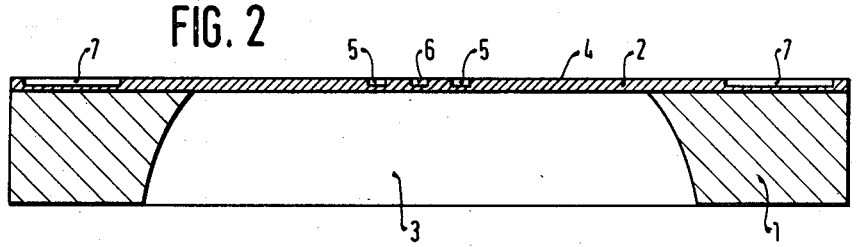
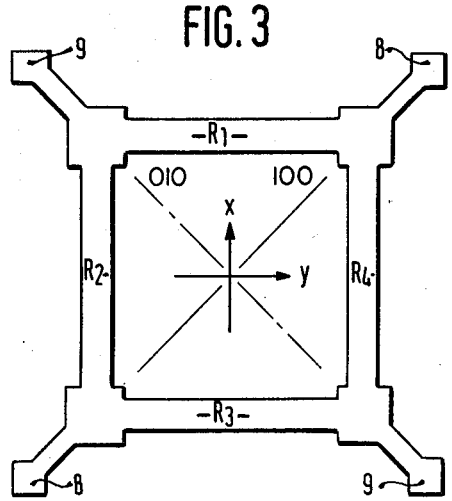
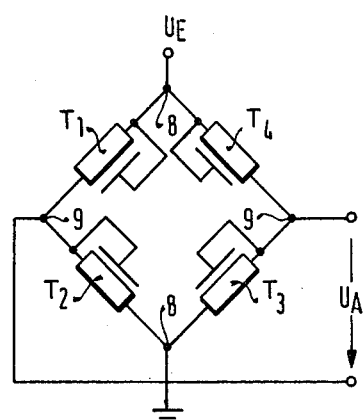

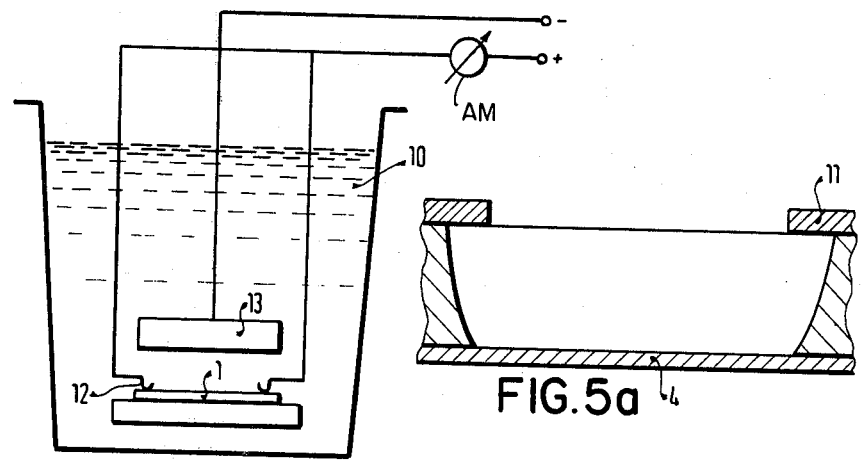
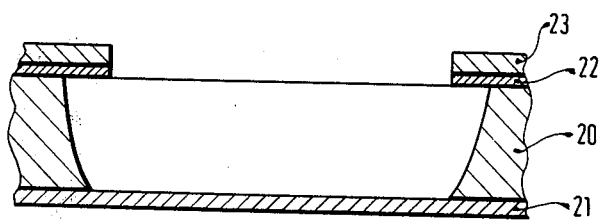

MONOLITHIC SEMICONDUCTOR PRESSURE SENSOR, AND METHOD OF ITS MANUFACTURE

The present invention relates to a monolithic semiconductor pressure sensor, and more particularly to such a device which can be constructed to include an integrated piezo-resistive bridge network, and to a method of manufacture of the device.

BACKGROUND AND PRIOR ART

The specific resistance of single-crystal semiconductor changes upon pressures or forces thereon resulting in strains within the semiconductor element. This is known as the piezo-resistive effect. With respect to the crystal, the effect is anisotropic, that is, it depends on the direction of the forces with respect to the respective planes of the crystal, typically a silicon crystal, and with the respect to the direction of current flow in the crystal element which form resistances, the resistance of which varies in accordance with the strain within the semiconductor itself. Various types of pressure sensors, force sensors, acceleration sensors, and the like, operating on the basis of this principle are known. The piezo-resistive resistance elements can be located in various crystal planes of the silicon crystal. The particular location of the resistance with respect to the crystal plane has respective advantages and disadvantages in application. Preferred crystal planes for the resistances are the (111)-plane, the (110)-plane, and the (001)-plane.

To determine the change in resistance upon change in strain within the semiconductor material, that is, to determine applied pressure, force or other parameter acting on the crystal, it has been proposed to include the resistance of the crystal in a bridge network. All, or at least a portion of the resistances of the bridge network, can be placed on an elastic support which, to measure pressure, can be formed as a membrane. Various shapes of such a membrane have been proposed. Either circular or rectangular membranes are preferred. Upon application of pressure to a circular membrane, the mechanical strain therein depends on the distance from the center of the membrane. The mechanical strain at the center of the membrane is the same for all directions. To measure applied pressure, it is thus necessary to locate the resistances on a circular membrane unsymmetrically or eccentrically with respect thereto, so that the different resistance branches of the bridge will have different resistances and will have different resistance changes upon application of pressure which do not compensate to zero. This arrangement leads to problems with linearity of the piezo-resistive resistance bridge and to undesired offset voltages of the electric output signal obtained from the pressure sensor system. One of the advantages of an arrangement with a circular membrane is the relative ease of exact reproducibility of the circular membrane itself.

Rectangular membranes have advantages and disadvantages with respect to the circular membrane; they are more suitable to obtain measurements since the mechanical strain in the longitudinal and transverse direction may be substantially different. A square resistance bridge can thus be located in the center of a rectangular membrane, thus improving the linearity and offset characteristics of the overall piezo-resistive devices. In dependence on the manufacturing process of the membrane, however, the accuracy of exact reproduction is poor. The membrane is usually made by etching. Consequently, there is a wide difference in characteristics of membranes which should be identical, and the tolerance variation in response and sensitivity of theoretically similar devices is wide. Rectangular membranes further are subject to increased mechanical stresses at the edges and the corners of the membrane and fracture of the membrane at those points is a frequently recurring problem.

THE INVENTION

It is an object to provide a semiconductor pressure sensor in which the above referred-to disadvantages are effectively avoided, and which permits accurate reproduction of semiconductor piezo-resistive pressure sensors with reproducible identical predictable characteristics.

Briefly, an elliptical membrane is used which, thus, will not have corners; it is substantially more resistant to fracture and thus can accept higher loading than a rectangular membrane. Additionally, it can be easily reproduced—similar to a circular membrane. The elliptical membrane permits locating a square bridge circuit in the center of the membrane which provides for an element having good linearity and offset characteristics of the resistance bridge. Additionally, the characteristics of the overall device can be readily mathematically analyzed.

In accordance with a feature of the invention, an elliptical membrane is made by an etching process, it is necessary that the etching process be carried out rapidly so that the lattice structure of the silicon does not affect the membrane itself; etching, thus, must be carried out isotropically.

A rapid etching process is electrochemical etching as well as chemical etching utilizing, in a preferred from, diluted hydrofluoric acid in connection with a voltage source, or an acid mixture which includes hydrofluoric acid, nitric acid and acetic acid and etch away silicon formed with an epitaxial layer thereon, the epitaxial layer being left and forming the membrane.

Drawings, illustrating a preferred embodiment, and schematically illustrating the manufacturing process:

FIG. 1 is a highly schematic isometric view of a pressure sensor;

FIG. 2 is a section through the sensor;

FIG. 3 is a schematic top view of the piezo-resistive resistance bridge;

FIG. 4 is an equivalent circuit diagram of a resistance bridge utilizing transistors as the resistances;

FIG. 5 illustrates, schematically, an etching set-up for an electrochemical etching process;

FIG. 5a is a transverse sectional view through the sensor illustrating the result of the etching process; and FIG. 6 illustrates, schematically, the result when using a chemical etching process.

An n+ doped low-resistance silicon substrate 1 has a high resistance n-epitaxial layer 2 applied thereto. The principal plane of the pressure sensor chip is parallel to the (001)-plane of a single crystal of silicon. The side edges with respect to the (100)-crystal axis and the (010)-crystal axis form angles of 45° therewith. The length of the edge of the square chip is, for example, 4.3 mm. An elliptical recess or cavern 3 is etched in the center of the underside of the chip. The main axis of the elliptical cavern extend parallel to the edges of the chip. The main axes of the elliptical cavern have a length ratio of about 2:1; if the longer main axis is 2.8 mm, the shorter main axis is about 1.4 mm. A thin membrane 4 formed by the epitaxial layer is all that is left in the region of the etched cavern. The membrane is held at the edges by the substrate 1 (see FIG. 2). A p-conductive square resistance bridge 5 is applied in the center of the membrane by diffusion or by ion implantation with boron. The resistance bridge 5 is thus integrated on the epitaxial layer. It has resistance branches parallel to the edges of the chip which are about 0.22 mm long. The longitudinal direction of the resistance branches, like the side edges of the chip, are rotated by 45° with respect to the axes of the crystal in the (100) and (010)-direction, respectively.

A transistor 6 is integrated on the membrane in the center of the resistance bridge to measure the temperature thereof; the edges of the chip may have an electronic circuit 7 integrated thereon to supply operating voltages for the measuring bridge and to process the output signal therefrom. The transistor 6 and the circuit 7 are standard and may be in accordance with any well known arrangement, and do not form part of the concept of the present invention.

FIG. 2 shows a longitudinal section through the chip along the major axis of the elliptical membrane, that is, the x-axis. The silicon substrate 1 has the epitaxial layer 2 thereon which, in the region of the cavern 3 etched out from below, forms the membrane 4. The piezo-resistive 5, $R_1$ to $R_4$, are integrated on the membrane. These resistances may be pure ohmic resistances; they may, however, also be formed by transistors, for example by four integrated field effect transistors (FETs) $T_1$, $T_2$, $T_3$, $T_4$, as shown in FIG. 4.

FIG. 3 illustrates a top of the piezo-resistive resistance bridge; FIG. 4 is the equivalent electric diagram of a bridge using FETs.

Operation: Assuming that the membrane is not subject to any pressure, the resistances $R_1$ and $R_4$ (or the conduction of the transistors $T_1$ to $T_4$) with be equal. The square measuring bridge, thus, is symmetrical. A voltage $U_E$ applied on two diagonal contacts 8 thus will not result in an output voltage $U_A$ between the two other diagonal terminals 9.

Upon application of pressure on the membrane, mechanical strain and deformation of the membrane will result. Since the resistance bridge is located exactly in the center of the membrane, the mechanical strain in the oppositely positioned resistance bridges is equal. The mechanical strain in the center of the membrane has the same sign in the x- and y-directions. As determined by the ratio of the main axes of the membrane, the mechanical strain in the y-direction—that of the smaller main axis—is approximately twice that as the strain in the x-direction, that is, the direction of the larger main axis.

The piezo-resistive effect in the resistance branches—or transistor branches, FIG. 4—is a combined effect due to the effect in transverse direction as well as in longitudinal direction, since each resistance branch will be subject to mechanical strain in the direction of current flow as well as to main mechanical strain in direction transverse to current flow.

By so locating the resistance bridge and the elliptical membrane with respect to the crystal axes of the silicon monocrystal, the resistance $R_1$ and $R_3$, and $R_2$ and $R_4$, respectively, will change by approximately the same extent upon application of pressure on the membrane. The change in resistance at adjacent resistance branches will be approximately equal in level or amplitude, but with respectively reversed sign. Thus, within the linear strain region of the silicon, an output signal which is proportional to pressure p of $U_A = f(p)$ will be obtained.

Method of manufacture of the strain sensor: A low-resistance n+ doped silicon chip 1 has a thin, high-resistance n-epitaxial layer 2 applied thereto. The piezo-resistive p-doped resistance bridge 5 and the electronic circuit 7 are then integrated on the pressure sensor chip; if desired, rather than using resistors, the transistors (FIG. 4) can be integrated thereon by well known processes.

Thereafter, the lower side of the substrate chip is masked with photoresist lacquer 11 (FIG. 5) and the chip inverted; the masking is so carried out that an elliptical opening will remain in the center of the chip (see FIG. 1).

The thus masked chip 1 is introduced in a bath 10 of diluted hydrofluoric acid. Platinum contacts 12 are applied to the chip 1 and connected to the positive terminal of a voltage source, so that the chip 1 will operate as the anode. An electrode 13, of a material resistant to the acid and to etching, is located above the silicon plate, and connected to the negative terminal of the source. The etching process practically stops when the low-resistance substrate is etched off, so that the electrical current is limited by the resistance of the epitaxial layer. This time can be detected by measuring current flow in an ammeter AM in circuit with the electrodes and the source. The epitaxial layer will remain as the membrane 4 and will be supported by the masked edges of the substrate—see FIG. 5a.

EXAMPLE 1

The voltage applied across electrodes 12, 13 was about 12V, requiring an etching time of about 30 min. for a chip of 280 μm thickness; resistance of substrate 1 < 0.015Ω cm; resistance of epitaxial layer 4: 5–10Ω cm composition of etching bath: 5% hydrofluoric acid Chemical etch process, with reference to FIG. 6: An n+ doped silicon chip 20, on which an n-doped high-resistance epitaxial layer 21 is applied, has a thin coating of chromium 22 applied at the bottom thereof, on which a mask of gold 23 is applied. The elliptical shape of the membrane to define the cavern within the chip is left free or blank. The entire thus masked chip is introduced into an etch bath formed by a mixture of hydrofluoric acid, nitric acid and acetic acid. Since the etching rate in the n-epitaxial layer 21 is less, this layer will remain in form of a membrane, retained by the substrate at the edges where it was coated with the gold layer.

EXAMPLE 2

Thickness of chip 20: 280 μm
thickness of epitaxial layer 21: 20–30μm
thickness of chromium layer 22: 5–10 μm
thickness of gold mask 23: 100–200 μm
composition of etching bath: 1p hydrofluoric acid, (50%),
3p nitric acid, (70%), 8p acetic acid, (99%), all by volume.
Approximate etching time: 30 min.
The processes can be carried out at room temperature.

Various changes and modifications may be made, and features described in connection with any one of the embodiments may be used with any of the others, within the scope of the inventive concept.

We claim:
1. Monolithic semiconductor pressure sensor comprising a substrate (1) forming a support, formed with a cavity (3) therein;

a membrane (4) of semiconductor material spanning the cavity, and flexing when subjected to pressure, and thereby changing its electrical conductivity due to piezo-resistive effect; and electrical piezo-resistive sensing means ($R_1$–$R_4$; $T_1$–$T_4$) sensing strain in the membrane (4), wherein, in accordance with the invention, the membrane (4) in plan view has an elliptical shape.

2. Sensor according to cliam 1, wherein the electrical sensing means comprises a bridge circuit including four resistance elements ($R_1$–$R_4$; $T_1$–$T_4$) integrated on the membrane.

3. Sensor according to claim 2, wherein the resistance means comprises a piezo-resistive bridge including four integrated transistors.

4. Sensor according to claim 1, wherein the substrate (1) comprises an n+ conductive silicon chip, and the membrane (4) comprises an epitaxial layer (2) of n-conductive silicon applied to the n+ substrate chip.

5. Sensor according to claim 1, wherein the principal plane of the elliptical membrane (4) is parallel to the (100)-plane of the silicon substrate;

and wherein the silicon substrate is a silicon single crystal.

6. Sensor according to claim 5, wherein the principal axes of the elliptical membrane have a length ratio of about 2:1;

and the principal axes of the elliptical membrane form an angle of 45° with the principal axes (100) and (010) of the crystal axes.

7. Sensor according to claim 6, wherein the substrate (1) comprises a chip of n+ single crystal silicon and the membrane comprises an epitaxial layer (2) of n-conductive silicon;

and wherein the resistance means comprises a piezo-resistive resistance bridge (5) which is p-conductive, the piezo-resistive resistance bridge comprises boron integrated into the membrane (4) in the major plane of the chip (1).

8. Sensor according to claim 7, wherein the boron comprises boron zones integrated in the membrane by diffusion or ion implantation.

9. Sensor according to claim 7, wherein the piezo-resistive resistance bridge has an essentially square configuration, in plan view, in which the bridge has four branches which are directly connected and, in unstressed condition of the membrane, of effectively equal resistance value;

the resistance bridge being centrally located in the membrane.

10. Sensor according to claim 9, wherein the resistance branches of the piezo-resistive bridge are rotated with respect to the (100) and (010) crystal axes by 45°.

11. Sensor according to claim 3, wherein the integrated transistors are formed in square configuration, in plan view, having four branches which are directly connected of effectively the same resistance when the membrane is unstressed, located in the center of the membrane, and integrated thereon;

and wherein the transistor bridges of the piezo-resistive bridge are rotated by 45° with respect to the (100) and (010) crystal axes of the substrate chip, said substrate chip comprising a monocrystal of n+ conductive silicon on which the membrane is formed by an epitaxial layer (2) of n-conductive silicon, the main plane of the elliptical membrane extending parallel to the (100)-plane of the silicon monocrystal, and the main axes of the elliptical membrane have a length ratio of about 2:1.

* * * * *